United States Patent [19]

Ham

[11] Patent Number: 5,635,314
[45] Date of Patent: Jun. 3, 1997

[54] PHASE SHIFT MASK COMPRISING MICRO SPACES IN PERIPHERAL OPAQUE REGIONS

[75] Inventor: Young M. Ham, Ichonkun, Rep. of Korea

[73] Assignee: Hyundai Electronics Industries Co., Ltd., Rep. of Korea

[21] Appl. No.: 492,746

[22] Filed: Jun. 21, 1995

[30] Foreign Application Priority Data

Jun. 23, 1994 [KR] Rep. of Korea ............ 1994-14494

[51] Int. Cl.$^6$ ............................................. G03F 9/00
[52] U.S. Cl. ............................ 430/5; 430/322; 430/324
[58] Field of Search ............................ 430/5, 322, 324

[56] References Cited

U.S. PATENT DOCUMENTS 5,318,868  6/1994  Hasegawa et al. ..................... 430/5
5,380,609  1/1995  Fujita et al. .
5,409,789  4/1995  Ito .

*Primary Examiner*—S. Rosasco
*Attorney, Agent, or Firm*—Merchant, Gould, Smith, Edell, Welter & Schmidt

[57] ABSTRACT

The present invention relates to a phase shift mask for modifying blackout patterns at the peripheral sites of the mask, thereby capable of compensating the differences in the light intensity at the peripheral sites of the mask where the light intensity is relatively reduced after light has passed through the mask. The present invention enables the uniformity of critical dimension of the patterns in photoresist film, thus enhances the reliability and the yield of devices.

3 Claims, 3 Drawing Sheets

PHASE SHIFT MASK COMPRISING MICRO SPACES IN PERIPHERAL OPAQUE REGIONS

BACKGROUND OF THE INVENTION

1. Field of the Invention

The present invention relates to a method for mask fabrication used in the process of lithography which is one of the fabrication processes for fabricating a semiconductor, and more particularly to a phase shift mask using phase shift material.

2. Description of the Prior Art

A photolithography process, one of the fabrication processes for a semiconductor, is a technique for delineating a designated pattern upon a photoresist film coated over a wafer surface, using a mask and stepper. A phase shift mask used in the photolithography process could result in a better resolution than one which results from a conventional mask fabricated with chrome film. This enables ultra micro pattern formation as required for high integration of semiconductor devices.

Referring to FIG. 1, phase shift material will be briefly explained. Intensity distribution curve 2 of exposure light resulting from phase shift material 1 shows that the intensity of exposure light is reduced at the lateral edge of phase shift material 1 which has phase changes from 0° to 180°, and that the use of positive photoresist film results in photoresist patterns at the lateral edge of phase shift material.

FIG. 2 shows a cross sectional view of a traditional phase shift mask and an intensity distribution curve of exposure light passing through the phase shift mask. A phase shift mask, on quartz 4 is formed with chrome patterns 3. A phase shift mask pattern covers not only the space between one chrome pattern and the most adjacent chrome pattern but also a designated part of said two chrome patterns.

The lateral edge of phase shift material 1 with phase changes from 0° to 180° on the chrome film has the advantage of compensating the reduction of resolution occurring when only chrome 3 film is used.

As shown in FIG. 2, the intensity of light 2' passing through the peripheral sites of the mask is less than the intensity of light 2" passing through the central part of the mask, hence resulting in the different critical dimension of the patterns between the central patterns and the peripheral patterns of the photoresist film.

SUMMARY OF THE INVENTION

It is therefore an object of the present invention to provide a phase shift mask which makes up the intensity of light in a part which has a relatively weaker light intensity compared to other parts.

In order to attain the foregoing object, in a phase shift mask having the structure of being formed with multiple blackout patterns on the substrate thereof at regular intervals and being formed with phase shift material pattern covering not only the space between one blackout pattern and the most adjacent blackout pattern but also the designated part of said two blackout patterns, the present invention forms micro spaces of a size which allows light interference without defining patterns at a designated site of blackout patterns positioned at peripheral sites of the mask where light intensity is relatively reduced after light has passed through the mask.

In a phase shift mask having the structure of being formed with multiple blackout patterns on the substrate thereof at regular intervals and being formed with a phase shift material pattern covering not only the space between one blackout pattern and the most adjacent blackout pattern but also designated parts of said two blackout patterns, it is another object of the present invention to form inner or outer blackout patterns to be thicker than other blackout patterns by a designated size, and among the blackout patterns positioned at the peripheral sites of the mask where light intensity is relatively reduced after light has passed through the mask to have smaller width than the width of blackout patterns in the other sites by a designated size.

BRIEF DESCRIPTION OF THE DRAWING

The above and other objects, features and advantages of the present invention will be clearly understood from the following detailed description taken in conjunction with the accompanying diagrams, in which.

DETAILED DESCRIPTION OF THE PREFERRED EMBODIMENT

Figure 1:
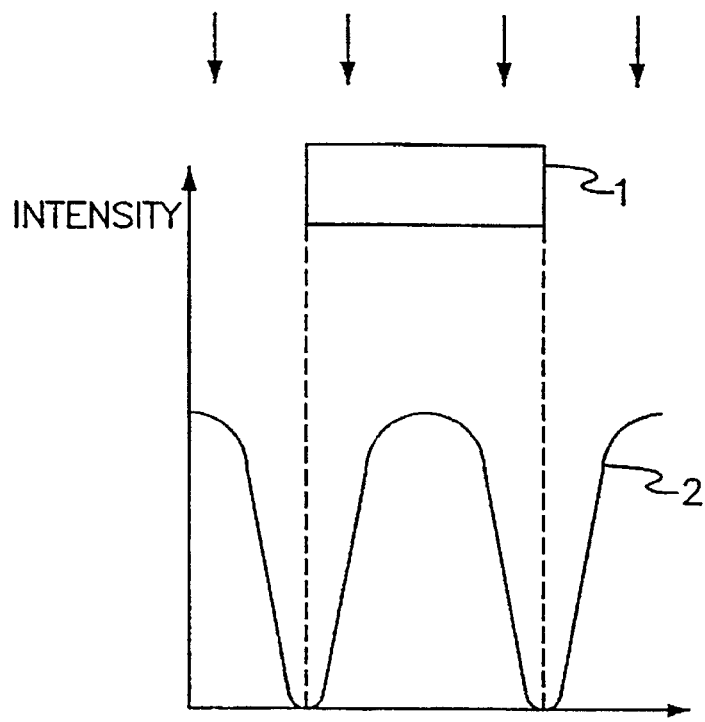
FIG. 1 shows the intensity distribution curve of the exposure light resulted from phase shift material.
Figure 2:
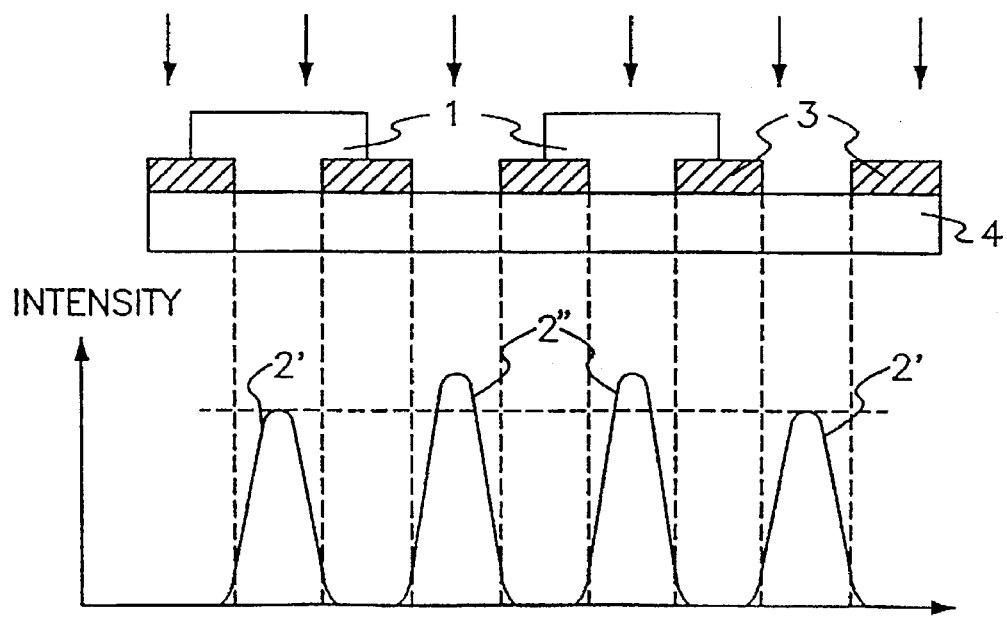
FIG. 2 shows a cross sectional view of a traditional phase shift mask and an intensity distribution curve of exposure light.
Figure 3:
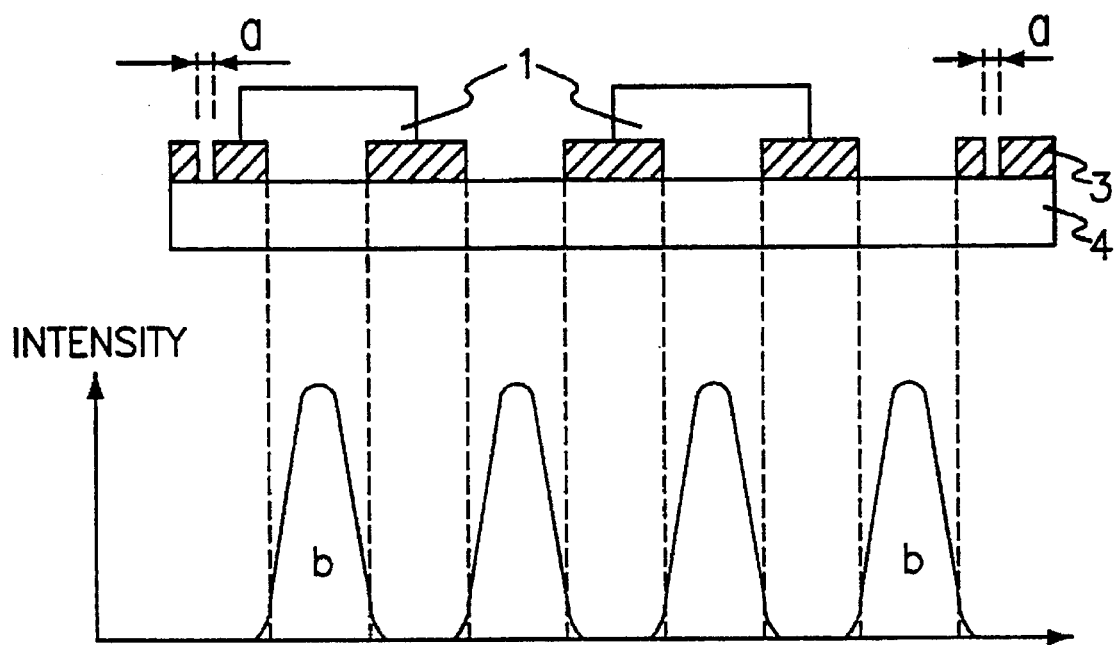
FIG. 3 shows a cross sectional view of a phase shift mask and an intensity distribution curve according to one embodiment of the present invention for compensating the intensity of light on the peripheral sites of the mask.

FIG. 3 shows a cross sectional view of a phase shift mask and a light intensity distribution curve according to one embodiment of the present invention. As shown in FIG. 3, chrome films 3 at the peripheral sites of a phase shift mask where the light intensity is reduced after light has passed through the mask, are formed with micro spaces of a size for not allowing the projection of patterns. In this phase shift mask, interference occurs in the light passing through the micro spaces (a) formed in the chrome films (i.e. blackout patterns), and thus results in the increase of the light intensity distribution (b) and compensates for differences in the critical dimension of the photoresist pattern.

Figure 4A:
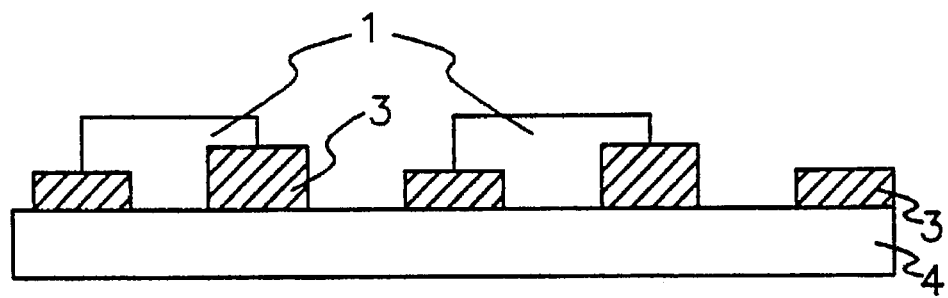
FIG. 4A and FIG. 4B show a cross sectional view of a phase shift mask according to another embodiment of the present invention for compensating the intensity of light on the peripheral sites of the mask.
Figure 4B:
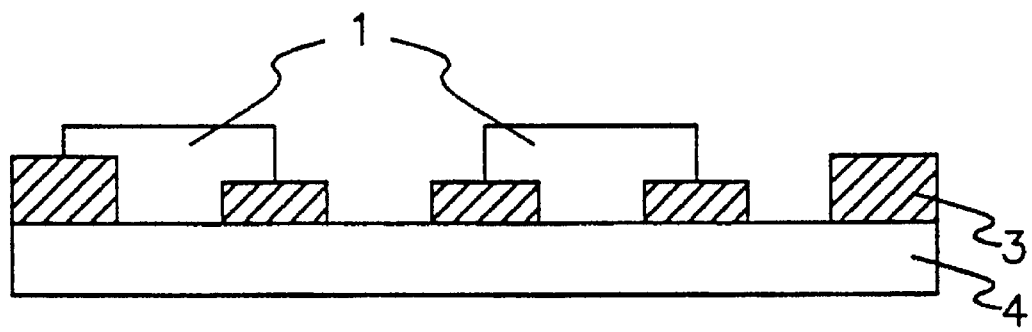

FIGS. 4A and 4B show a cross sectional view of a phase shift mask according to another embodiment of the present invention. As shown in FIGS. 4A and 4B, inner or outer chrome patterns 3 (i.e. blackout patterns) among the patterns positioned at the peripheral sites of the mask where the light intensity is reduced after light has passed through the mask have thicker patterns than other chrome patterns, which thus results in irregular reflections at the lateral edge of the thickly formed chrome patterns and which compensates for differences.

Figure 5:
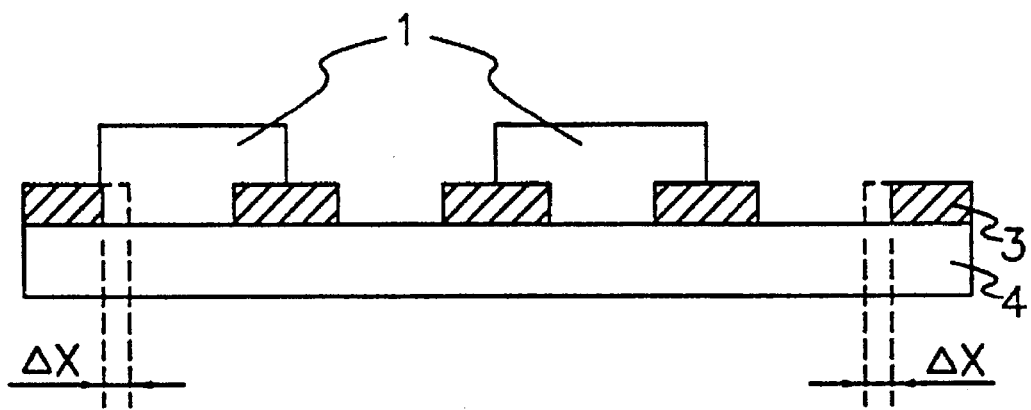
FIG. 5 shows a cross sectional view of a phase shift mask according to another embodiment of the present invention.

As shown in FIG. 5, during a process of lay out, chrome patterns 3 (i.e. blackout patterns) at the peripheral sites of a phase shift mask where the light intensity is reduced after light has passed through the mask are reduced in the sizes thereof by ΔX, thus compensating for the differences in the light intensity at the peripheral sites of the phase shift mask.

As forementioned a phase shift mask according to the present invention enables the uniformity of critical dimension of the patterns in a photoresist film, and thus enhances the reliability and the yield of devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What we claim are:

1. A phase shift mask having multiple blackout patterns at regular intervals on a mask substrate, said phase shift mask further including a phase shift material pattern covering space between one blackout pattern and an adjacent blackout pattern and also a designated part of said one and said adjacent blackout patterns said phase shift mask comprising:

micro spaces in peripheral site blackout patterns, said micro spaces having a size for allowing light interference without defining patterns at a designated site of a photoresist pattern, said peripheral site blackout patterns being positioned at peripheral sites of the mask where light intensity is otherwise reduced after light has passed through the mask relative to light intensity interior to the peripheral sites.

2. A phase shift mask having multiple blackout patterns at regular intervals on a substrate, said phase shift mask further including phase shift material pattern covering space between one blackout pattern and an adjacent blackout pattern and also a designated part of said one and said adjacent blackout patterns, said phase shift mask comprising:

one of inner and outer blackout patterns being thicker than other blackout patterns, said inner blackout patterns being interior relative to said outer blackout patterns, said inner and outer blackout patterns being positioned at peripheral sites of the mask where light intensity is otherwise reduced after light has passed through the mask relative to light intensity interior to the peripheral sites.

3. A phase shift mask having multiple blackout patterns at regular intervals on a substrate, said phase shift mask further including a phase shift material pattern covering space between one blackout pattern and an adjacent blackout pattern and also a designated part of said one and said adjacent blackout patterns, said phase shift mask comprising:

peripheral site blackout patterns positioned at the peripheral sites of the mask where light intensity is otherwise reduced after light has passed through the mask, said peripheral site blackout patterns being smaller in width by a designated size than blackout patterns at other sites.

* * * * *